United States Patent [19]
Love et al.

[11] Patent Number: 5,856,213
[45] Date of Patent: Jan. 5, 1999

[54] METHOD OF FABRICATING A PROGRAMMABLE FUNCTION SYSTEM BLOCK USING TWO MASKS AND A SACRIFICIAL OXIDE LAYER BETWEEN THE BOTTOM METAL AND AN AMORPHOUS SILICON ANTIFUSE STRUCTURE

[75] Inventors: Michela S. Love; Delbert H. Parks, both of San Antonio, Tex.

[73] Assignee: VLSI Technology, Inc., San Jose, Calif.

[21] Appl. No.: 687,234

[22] Filed: Jul. 25, 1996

[51] Int. Cl.$^6$ ..................................... H01L 21/70
[52] U.S. Cl. .................. 438/131; 438/467; 438/530; 438/351
[58] Field of Search ..................... 438/467, 351, 438/131, 600; 257/530; 148/DIG. 55

[56] References Cited

U.S. PATENT DOCUMENTS

| | | | |
|---|---|---|---|
| 5,070,384 | 12/1991 | McCollum et al. | 257/530 |
| 5,120,679 | 6/1992 | Boardman et al. . | |
| 5,290,734 | 3/1994 | Boardman et al. . | |
| 5,328,868 | 7/1994 | Conti et al. . | |
| 5,633,189 | 5/1997 | Yen et al. | 438/600 |

OTHER PUBLICATIONS

Conducting Filament of the Programmed Metal Electrode Amorphous Silicon Antifuse, Kathryn E. Gordon and Richard J. Wong, pp. IEDM 93–27 thru –30–IEDM 93.
Developments in Non–Volatile FPGAs, Electronic Engineering, Apr. 1993, pp. 43, 45 and reference page.

*Primary Examiner*—Charles L. Bowers, Jr.
*Assistant Examiner*—Craig Thompson
*Attorney, Agent, or Firm*—Flehr Hohbach Test Albritton and Herbert LLP

[57] ABSTRACT

An antifuse structure is formed between two metal contacts in which a thin oxide layer is formed on the first or bottom metal, a shallow via is provided oxide layer and a layer of amorphous silicon is deposited over the thin oxide and into the shallow via without leaving the usual furrows in the amorphous silicon and thereby eliminating the step coverage problems of cusps forming in the subsequently applied second or top metal.

13 Claims, 2 Drawing Sheets

METHOD OF FABRICATING A PROGRAMMABLE FUNCTION SYSTEM BLOCK USING TWO MASKS AND A SACRIFICIAL OXIDE LAYER BETWEEN THE BOTTOM METAL AND AN AMORPHOUS SILICON ANTIFUSE STRUCTURE

The present invention relates generally to the fabrication of integrated circuits and more specifically to the fabrication of antifuse structures as used in programmable function system blocks (pFSB's), such as field programmable gate arrays (FPGA's) and programmable read-only memories (PROM's).

BACKGROUND OF THE INVENTION

Programmable integrated circuits include many individual devices, such as memory cells, on a single circuit chip. The selection of the individual cells for connection to external circuits determines the programming of the integrated circuit. In order to place a particular cell in or out of the overall circuit, a line or link is created between a first or bottom metal layer and a second or top metal layer. The two metal layers can be connected to a source of electrical power for programming purposes. The link acts somewhat on the order of a switch which is either normally open or normally closed. In some pFSB's, these switches can be changed from their normal to their switched position only once and these comprise the write once pFSB's and the like. In addition there are erasable pFSB's such as erasable programmable read only memories (EPROM's) in which the switch may be opened and closed more than once.

When the switchable link is in the form of a normally closed switch, it is known as a "fuse" and, in its original state, the individual memory cell or other device is connected to the outer circuit through the fuse. The fuses are usually made of metal such as an alloy of titanium and tungsten and are relatively easy to fabricate with precision. In programming such a circuit, individual fuses are subjected to a sufficiently high current to destroy or blow the fuse thereby changing the switch from closed to open.

When the switchable link is in the form of a normally open switch, it is known as an "antifuse". The antifuse is formed as a filament of high resistance material which can be converted to a low resistance material. Amorphous silicon is typically used as the antifuse material because it has a high initial resistance but can be converted into a low resistance material merely by the application of a particular voltage. The application of the programming voltage causes the amorphous silicon to melt and crystallize thereby becoming a conductor. In the use of antifuses, there are strict voltage requirements for programming the device and these requirements result in the need for precise thickness of the amorphous silicon used in the antifuse itself. If too low a programming voltage is applied, because the amorphous silicon is too thick, the amorphous silicon is not crystallized. If too high a voltage is applied, it may exceed the maximum tolerated by the related circuitry transistors.

Because reliable fuses are more easily fabricated they are, of course, less expensive. However, fuses are much larger than antifuses and, consequently, antifuses have become more in demand when there is a need for high packing density on a chip.

The amorphous silicon comprising the antifuse is usually located within a via between two levels of the integrated circuit. One of the levels includes a comb like array of conductors in one direction and the other level includes a similar comb like array perpendicular to the first. In the past, these vias have had a diameter of about one micrometer, but design features and compacting of cells on the integrated circuit require smaller and smaller vias.

In early approaches to fabricating the antifuse structure, the antifuse was fabricated on top of an interlevel metal oxide (IMO). The first metal layer was applied on the IMO and acted as its bottom electrode. Amorphous silicon was deposited on the bottom electrode and additional IMO was extended above the amorphous silicon. A via was etched in the silicon dioxide down to the amorphous silicon and the second metal electrode was deposited in the via and in contact with the amorphous silicon. Although it is desirable to fabricate the antifuse consistently with standard ASIC processing, this process was incompatible with the ASIC process since it required the additional metal layer on top of the IMO silicon dioxide and actually required three additional masking steps. Moreover, the etching of the via usually causes some slight change of the amorphous silicon. The via etch should stop at the interface with the amorphous silicon, but usually a few hundred angstroms of amorphous silicon are removed during the etch. Such removal, of course, alters the amorphous silicon's thickness and, as a consequence, the necessary voltage requirements for programming. The variations in the thickness of the amorphous silicon introduce unprogrammed states in the complete device and therefore lead to mortality failures. In order to overcome that problem, an etch stop layer has been deposited on top of the amorphous silicon. The etch stop layer was made thick enough that the via etch did not reach the amorphous silicon lying beneath it, and consequently the programming voltage depended upon the deposition of the amorphous silicon rather than the variability of the etch process. The etch stop could take the form of a conductive layer such as titanium-tungsten (TiW) or it could even be a dielectric such as silicon nitride (SiN).

In one proposed method of fabricating antifuses, amorphous silicon is deposited directly over unetched metal—a sandwich of aluminum-copper between two layers of titanium-tungsten alloy. In the etching of the amorphous silicon layer to define the antifuse structures, there is considerable danger that the etch will be active not only on the amorphous silicon, but also on the underlying metal. There is, therefore, a high risk of etching through the titaniun-tungsten alloy and corroding the underlying aluminum-copper layer. The corrosion may cut completely through the metal layer to make an open circuit. Even if the metal is not sufficiently corroded to create an open circuit, the corrosion is a reliability risk due to electromigration at the corrosion site.

In another recently developed method, a relatively thick layer of silicon dioxide is deposited over the titanium-tungsten strip, and a via is etched through the oxide. The oxide is approximately 300 nm thick and the amorphous silicon is deposited over the planar surface of the oxide and on the oxide walls of the via. However, the amorphous silicon in the via does not deposit in a uniform manner. Rather, furrows are formed in those portions of the amorphous silicon at the base of the vias adjacent the walls thereby creating lines of diminished amorphous silicon thickness. Since the programming voltage is dependent upon the minimum thickness of the amorphous silicon, the furrows create an unacceptable variable. To counter the effect of the furrows, an insulating layer of silicon dioxide is then deposited over the amorphous silicon and the bulk of the oxide is subsequently etched away so as to leave insulating silicon dioxide spacers in the furrows. The spacers effectively prevent the reduced thickness amorphous silicon from being subjected to the programming voltage.

BRIEF SUMMARY OF THE INVENTION

In accordance with the invention, a thin oxide barrier of merely 50 nm or less is employed, rather than the 300 nm oxide used earlier. The oxide then serves to protect the underlying metal from corrosion and only a shallow via is required to reach the underlying metal. When overcoated with amorphous silicon, the conformity of the amorphous silicon in the via does not have the step coverage problems as with the deep via since the depth of the via is too slight to give rise to the usual formation of furrows.

DETAILED DESCRIPTION OF THE PREFERRED EMBODIMENT OF THE INVENTION

Figure 1:
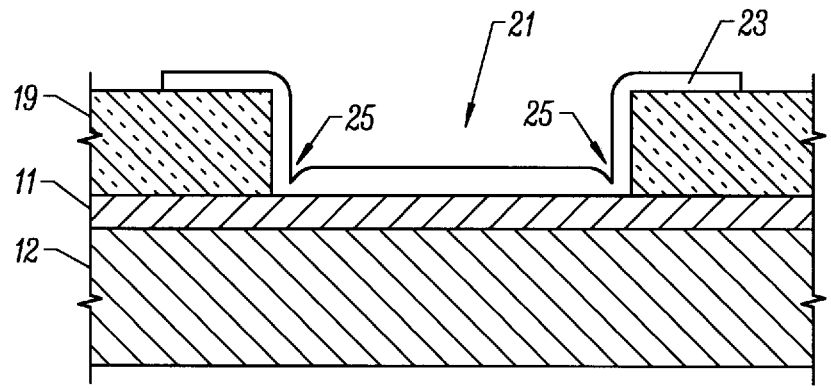
FIG. 1 is a schematic cross-sectional view of an integrated circuit showing a step in a different earlier method of fabricating antifuses.

Referring to FIG. 1, there is shown a prior art method of fabricating an antifuse substantially shown as U.S. Pat. No. 5,120,679 assigned to the assignee hereof. In FIG. 1 there is shown a metal layer or strap 11, comprised of a titanium and tungsten alloy, overlying a layer 12 of oxide. In this process an oxide layer 19, such as silicon dioxide, is deposited on the strap 11. The oxide layer 19 is relatively thick, in the neighborhood of 300 nanometers. The oxide layer 19 is then masked and a via hole 21 is etched into it. The mask is removed and an amorphous silicon layer 23 is applied and it too is eventually etched away, except for the portion that is shown in FIG. 1. The amorphous silicon layer 23 is a conformal deposition and generally conforms to the shape of the sides of the via hole 21 and to the bottom of the hole determined by the strap 11. However, it is recognized that in such depositions a furrow 25 appears near the intersection of the walls of the via and the surface on the strap 11. These furrows create a region of amorphous silicon that is much thinner than the remainder of the deposit and therefore leads to step coverage problems wherein the programming voltage requirements are poorly defined. The methods of the prior art to overcome these difficulties include the application of silicon dioxide spacers in the furrows 25 which, of course, require additional processing steps.

Figure 2A:
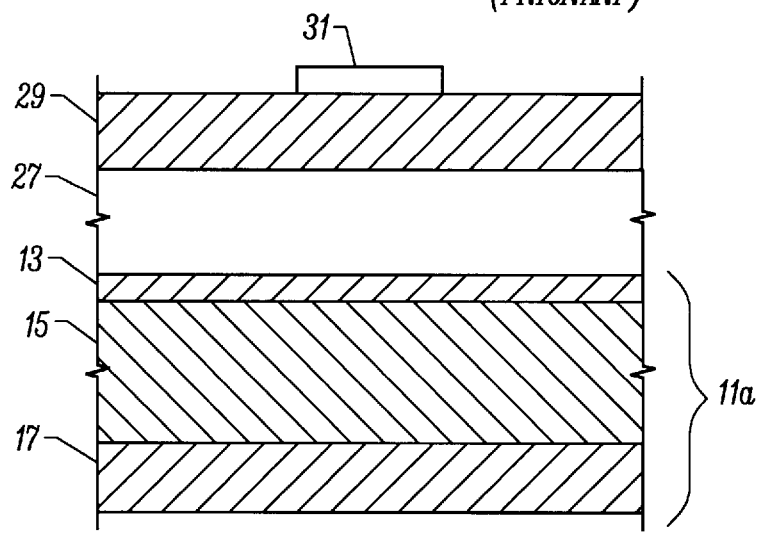
FIGS. 2A and 2B show two steps in an earlier process attempt for fabricating antifuse structures in an integrated circuit.
Figure 2B:
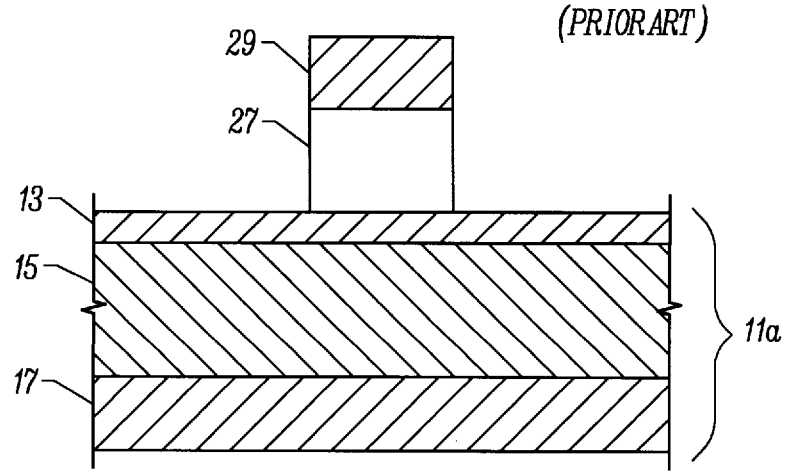

Referring to FIGS. 2A and 2B there is shown a cross-section of an antifuse in another process of fabrication which has been attempted by the assignee hereof but although the figures are labeled "Prior Art", has neither used, been on sale nor published prior to the invention hereof. In this process, a metal substrate 11a including a layer 13 of titanium-tungsten, a layer 15 of aluminum and copper and a layer 17 of titanium-tungsten were employed. A layer 27 of amorphous silicon was applied over the uppermost level 13 of the metal substrate 11a and another layer 29 of titanium-tungsten was deposited over the amorphous silicon 27 to form the second or top metal electrode. The amorphous silicon was to serve as the antifuse material and the uppermost metal layer 13 of the metal substrate 11a forms the other contact, that is the bottom contact, for the antifuse. A mask 31 was deposited on top of the titanium-tungsten layer 29.

The structure as shown in FIG. 2A was then etched to remove the titanium-tungsten layer 29 and the amorphous silicon layer 27 in those areas not protected by the mask 31. The resulting structure, shown in FIG. 2B, included a portion of amorphous silicon 27 and a portion of the titanium-tungsten layer 29 which served as the top contact for the antifuse. With such a process, when the amorphous silicon was etched away, the titanium-tungsten layer 13 was also subjected to some of the etching action and was damaged. The etch for the amorphous silicon utilizes a chlorine based chemistry which has poor selectivity to the titanium tungsten and therefore there was etching through the metal top layer 13 and actually corroding the aluminum copper layer 15 lying below.

Figure 3A:
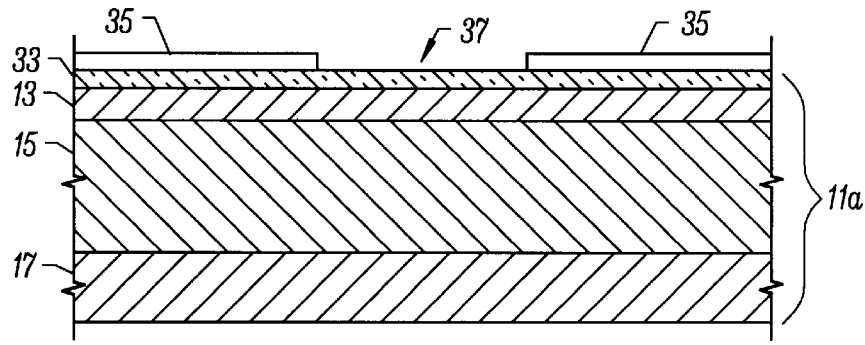
FIGS. 3A, 3B, 3C and 3D are four schematic cross-sections showing different steps of fabricating an antifuse in accordance with the invention.

In accordance with the present invention there is shown in FIG. 3A a cross-section of a metal substrate 11a again having a titanium-tungsten upper layer 13, an aluminum copper mid-layer 15 and a titanium-tungsten lower layer 17. In this particular instance, a thin layer 33 of silicon dioxide is applied over the metal substrate. The layer 33 is preferably 50 nm or less. A mask 35 is applied on the silicon dioxide leaving an opening 37 in the mask where the antifuse is to be formed.

Figure 3B:
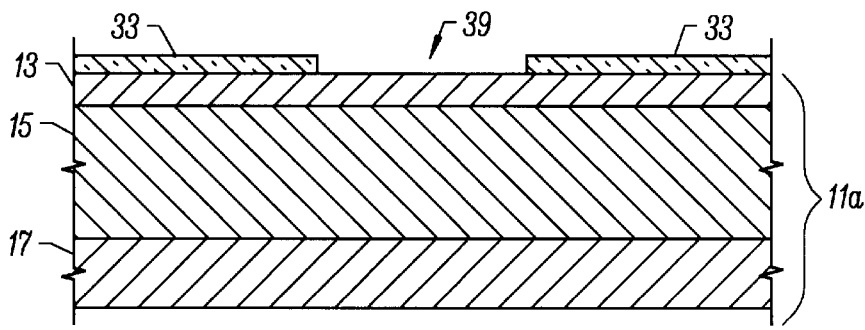
Figure 3C:
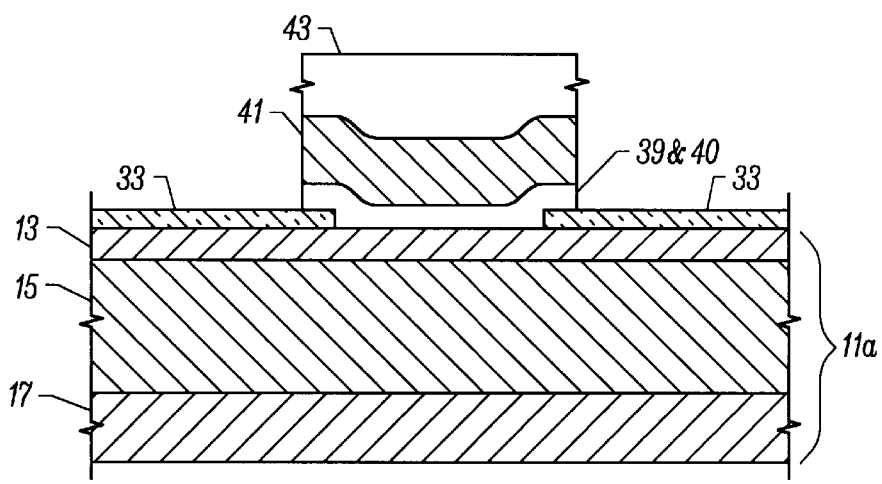
Figure 3D:
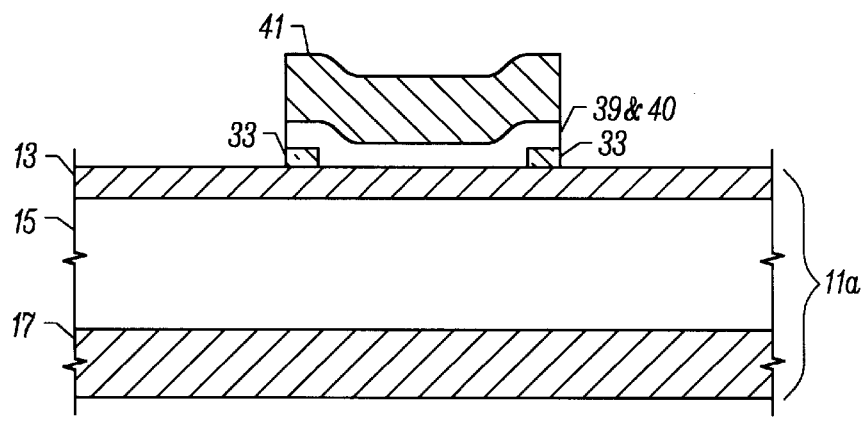

After applying a silicon dioxide etch the wafer takes the appearance as shown in FIG. 3B where a shallow via 39 is formed in the silicon dioxide layer 33. The via 39, being only about 50 nanometers deep, has far less tendency to create the furrow 25 than is the case in the much deeper via 21 of FIG. 1. Rather, the deposit of the amorphous silicon deposit 40 shown in FIG. 3C takes on the shape of a smooth shallow dip in the area of the via. Again a layer of metal 41 in the form of titanium-tungsten is applied over the amorphous silicon and a mask 43 is applied specifically in the area as shown in FIG. 3C. In particular, the unmasked etch regions defined by the mask 43 all overlay silicon dioxide layer 33. In other words, the mask 43 completely covers and overhangs the vias 39. The amorphous silicon 39, titanium-tungsten 41 stack is then etched with a polysilicon type etch process leaving the assembly as shown in FIG. 3C. This etch step has good selectivity with respect to silicon dioxide and therefore the etch is reliably stopped well before metal layer 13 of the substrate 11a. After an etch back of the sacrificial silicon dioxide layer and removal of the resist, the assembly takes the appearance as shown in FIG. 3D. Minimizing the oxide barrier layer thickness also addresses the etch back selectivity to the top layer titanium-tungsten concerns as well as limits of planarization impact of the additional layer in the fuse stack.

We claim:

1. A method for forming an antifuse structure, comprising the steps of:

providing an electrically conductive substrate;

forming a thin non-conductive barrier layer over said substrate;

forming an opening in said barrier layer through to said electrically conductive substrate;

depositing antifuse material over said barrier layer and in said barrier layer opening;

depositing an electrically conductive material over said antifuse material;

forming a mask over said electrically conductive material, wherein said mask completely covers said opening in said barrier layer;

removing said electrically conductive material and said antifuse material except for regions thereof covered by said mask; and removing said barrier layer except for regions thereof covered by remaining portions of said antifuse material.

2. The method of claim 1, wherein said electrically conductive substrate and said electrically conductive material are metal.

3. The method of claim 1, wherein said antifuse material is amorphous silicon.

4. The method of claim 1, wherein said thin non-conductive barrier layer has a thickness of 50 nanometers or less.

5. A method for forming an antifuse structure comprising:

providing an electrically conductive substrate;

forming a thin non-conductive barrier layer over said substrate;

said barrier layer having a thickness of about 50 nanometers or less;

forming an opening in said barrier layer through to said substrate;

depositing an antifuse material into said opening; and depositing an electrically conductive material over said antifuse material.

6. The method of claim 5, further including:

forming a mask over said electrically conductive material, wherein said mask completely covers said opening in said barrier layer; and removing said electrically conductive material and said antifuse material except for regions thereof covered by said mask.

7. The method of claim 5, wherein said electrically conductive substrate and said electrically conductive material are metal.

8. The method of claim 5 wherein said electrically conductive substrate is metal.

9. The method of claim 5 wherein said barrier layer is an oxide.

10. The method of claim 5 wherein said antifuse material is amorphous silicon.

11. The method of claim 5 wherein said electrically conductive material is metal.

12. A method for forming antifuse structures comprising:

providing a substrate of a first metal;

forming a thin silicon dioxide barrier layer over said substrate;

said barrier layer having a thickness of about 50 nanometers or less;

depositing a first mask over said barrier layer with openings in said mask where antifuses are to be formed;

etching said barrier layer through to the surface of said substrate in those areas left uncovered by said mask to provide openings in said barrier layer;

stripping said first mask;

depositing amorphous silicon over said barrier layer and into said openings;

depositing a second metal over said amorphous silicon;

removing said second metal and said amorphous silicon except in those areas where antifuses are to be formed; and removing the barrier layer surrounding the remaining amorphous silicon and said second metal.

13. A method for forming antifuse structures comprising:

providing a substrate of a first metal;

forming a thin silicon dioxide barrier layer over said substrate;

said barrier layer having a thickness of about 50 nanometers or less;

depositing a first mask over said barrier layer with openings in said mask where antifuses are to be formed;

etching said barrier layer through to the surface of said substrate in those areas left uncovered by said mask to provide openings in said barrier layer;

stripping said first mask;

depositing amorphous silicon over said barrier layer and into said openings;

depositing a second metal over said amorphous silicon;

depositing a second mask over said second metal in those areas where antifuses are to be formed;

etching said second metal and said amorphous silicon through to the surface of said barrier layer;

removing the barrier layer surrounding the remaining amorphous silicon and second metal; and stripping said second mask.

* * * * *